US008874828B2

(12) United States Patent
Fai et al.

(10) Patent No.: US 8,874,828 B2
(45) Date of Patent: Oct. 28, 2014

(54) SYSTEMS AND METHODS FOR PROVIDING EARLY HINTING TO NONVOLATILE MEMORY CHARGE PUMPS

(75) Inventors: Anthony Fai, Palo Alto, CA (US); Nicholas C. Seroff, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 331 days.

(21) Appl. No.: 13/462,286

(22) Filed: May 2, 2012

(65) Prior Publication Data
US 2013/0297852 A1 Nov. 7, 2013

(51) Int. Cl.
*G06F 12/00* (2006.01)
*G06F 3/06* (2006.01)

(52) U.S. Cl.
CPC ............ *G06F 3/0659* (2013.01); *G06F 3/0679* (2013.01); *G06F 3/0625* (2013.01)
USPC .......................................... 711/103; 711/167

(58) Field of Classification Search
CPC ............... G06F 3/0659; G06F 3/0625; G06F 2212/1028; G06F 1/329; G06F 13/1626; G06F 13/1642; G06F 12/0246; G06F 1/3275; G06F 3/0679; G11C 16/12; G11C 16/16; G11C 7/1051; G11C 7/1078; G11C 16/10; G11C 16/30
See application file for complete search history.

(56) References Cited

U.S. PATENT DOCUMENTS

| | | | |
|---|---|---|---|
| 8,533,403 B1 * | 9/2013 | Law ............................. 711/151 |
| 2002/0032843 A1 * | 3/2002 | Lofgren et al. ............... 711/154 |
| 2006/0181953 A1 * | 8/2006 | Rotenberg et al. ........ 365/230.06 |
| 2007/0204098 A1 * | 8/2007 | Eguchi et al. .................. 711/103 |
| 2010/0287391 A1 * | 11/2010 | Ochiai .......................... 713/320 |
| 2011/0060868 A1 * | 3/2011 | Haukness ..................... 711/103 |
| 2012/0011307 A1 * | 1/2012 | Kaki et al. .................... 711/103 |
| 2012/0020161 A1 * | 1/2012 | Haukness ................ 365/185.17 |
| 2012/0023346 A1 * | 1/2012 | Byom et al. .................. 713/320 |
| 2012/0023347 A1 * | 1/2012 | Byom et al. .................. 713/320 |
| 2012/0023348 A1 * | 1/2012 | Byom et al. .................. 713/320 |
| 2012/0084484 A1 * | 4/2012 | Post et al. ..................... 710/308 |
| 2012/0290864 A1 * | 11/2012 | Seroff .......................... 713/340 |
| 2013/0297856 A1 * | 11/2013 | Sonoda et al. ................ 711/103 |
| 2013/0326249 A1 * | 12/2013 | Navarro et al. ............... 713/320 |
| 2014/0068296 A1 * | 3/2014 | Byom et al. .................. 713/320 |
| 2014/0115352 A1 * | 4/2014 | Seroff .......................... 713/300 |

* cited by examiner

*Primary Examiner* — April Y Blair
*Assistant Examiner* — Michael C Kolb
(74) *Attorney, Agent, or Firm* — Van Court & Aldridge LLP

(57) ABSTRACT

Systems and methods for providing early hinting to nonvolatile memory charge pumps are disclosed. Charge pumps associated with one or more nonvolatile memory dies can be proactively activated based on a determination that a command queue of access requests contains at least a threshold number of consecutive access requests of the same type. Based on analysis of the command queue, the memory controller can transmit an early hint command to a nonvolatile memory die to proactively activate its charge pump to provide a voltage suitable for executing the consecutive access requests of the same type.

22 Claims, 5 Drawing Sheets

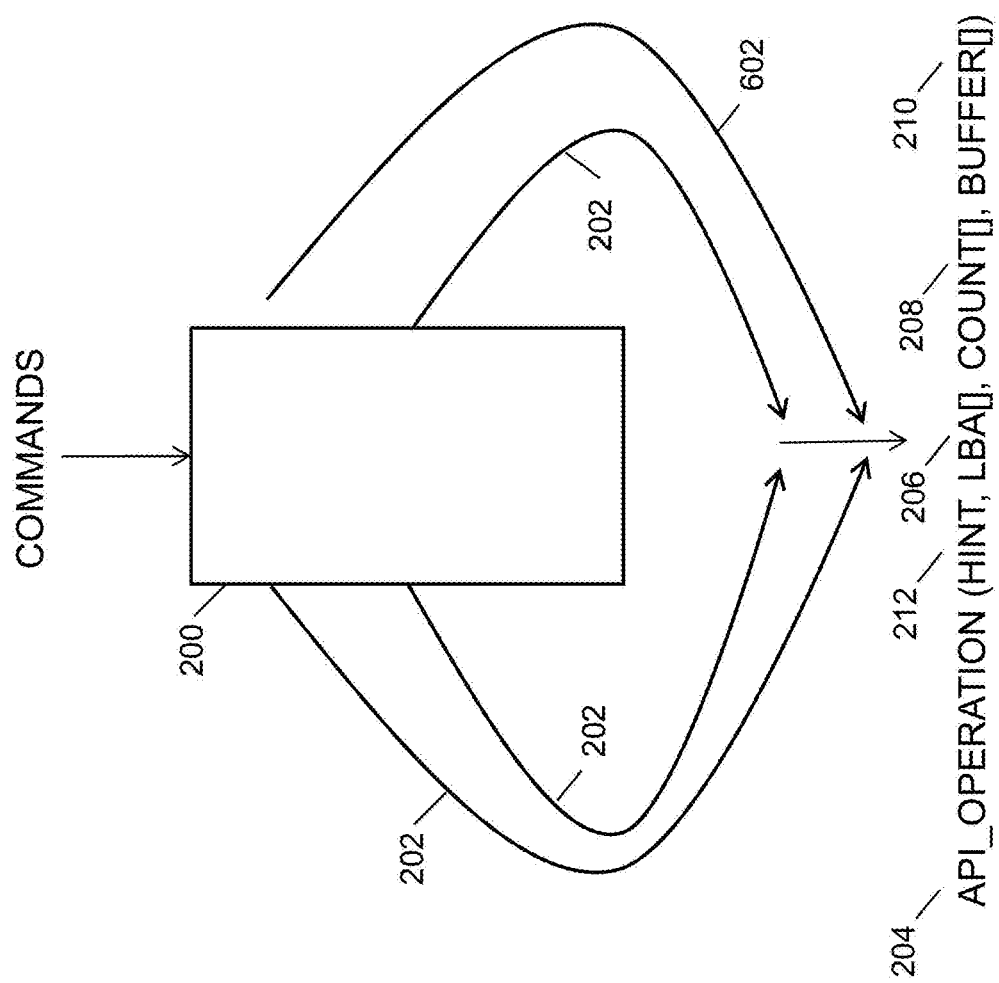

SYSTEMS AND METHODS FOR PROVIDING EARLY HINTING TO NONVOLATILE MEMORY CHARGE PUMPS

BACKGROUND

Various types of nonvolatile memory ("NVM"), such as flash memory (e.g., NAND flash memory and NOR flash memory), can be used for mass storage. For example, consumer electronics (e.g., portable media players) use flash memory to store data, including music, videos, images, and other media or types of information.

Memory controllers can be used to perform access requests (e.g., program, read, and erase operations) and memory management functions on NVM. In typical nonvolatile memory systems, these different access requests each require different voltage levels, one or more of which may exceed the voltage available from a system power supply. Charge pumps may be included to solve this problem. However, they introduce their own attendant drawbacks. In particular, charge pumps are typically activated and deactivated for each and every access request provided to the NVM. Moreover, the charge pump output voltage must be readjusted for consecutive access requests of different types. These drawbacks can result in added system latency and power loss.

SUMMARY

Systems and methods for providing early hinting to nonvolatile memory charge pumps are provided. A system for providing early hinting to nonvolatile memory charge pumps can include a host controller of a host device, a memory controller of an NVM package, and one or more NVM dies. Each NVM die can include a charge pump for generating voltages in excess of the system's power supply voltage. The higher voltages may be required, for example, for performing various access requests (e.g., read, program, and erase operations, which may all require different voltage levels) on the NVM dies. According to various embodiments, each charge pump may be physically located within or outside of, and communicatively coupled to, its respective NVM die. In further embodiments, each NVM die may be associated with more than one charge pump or, alternatively, a single charge pump may be shared across multiple NVM dies.

The charge pumps can be proactively activated based on a determination that a set of access requests received at a controller (e.g., the host controller or the memory controller) contains at least a threshold number of consecutive access requests of the same type. Based on analysis of the set of access requests, an early hint command can be transmitted to a nonvolatile memory die to proactively activate its charge pump for providing a voltage suitable for executing consecutive access requests of the same type. According to some embodiments, the early hint command can be provided to the NVM die over a side-band communications channel. After the access requests are executed, the charge pump may be deactivated.

According to some embodiments, the set of access requests may be re-queued by the controller in order to group together access requests of the same type and/or to optimize overall system performance.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which:

FIG. 2 is a graphical view of an illustrative command dispatcher configured in accordance with various embodiments;

DETAILED DESCRIPTION

Figure 1:
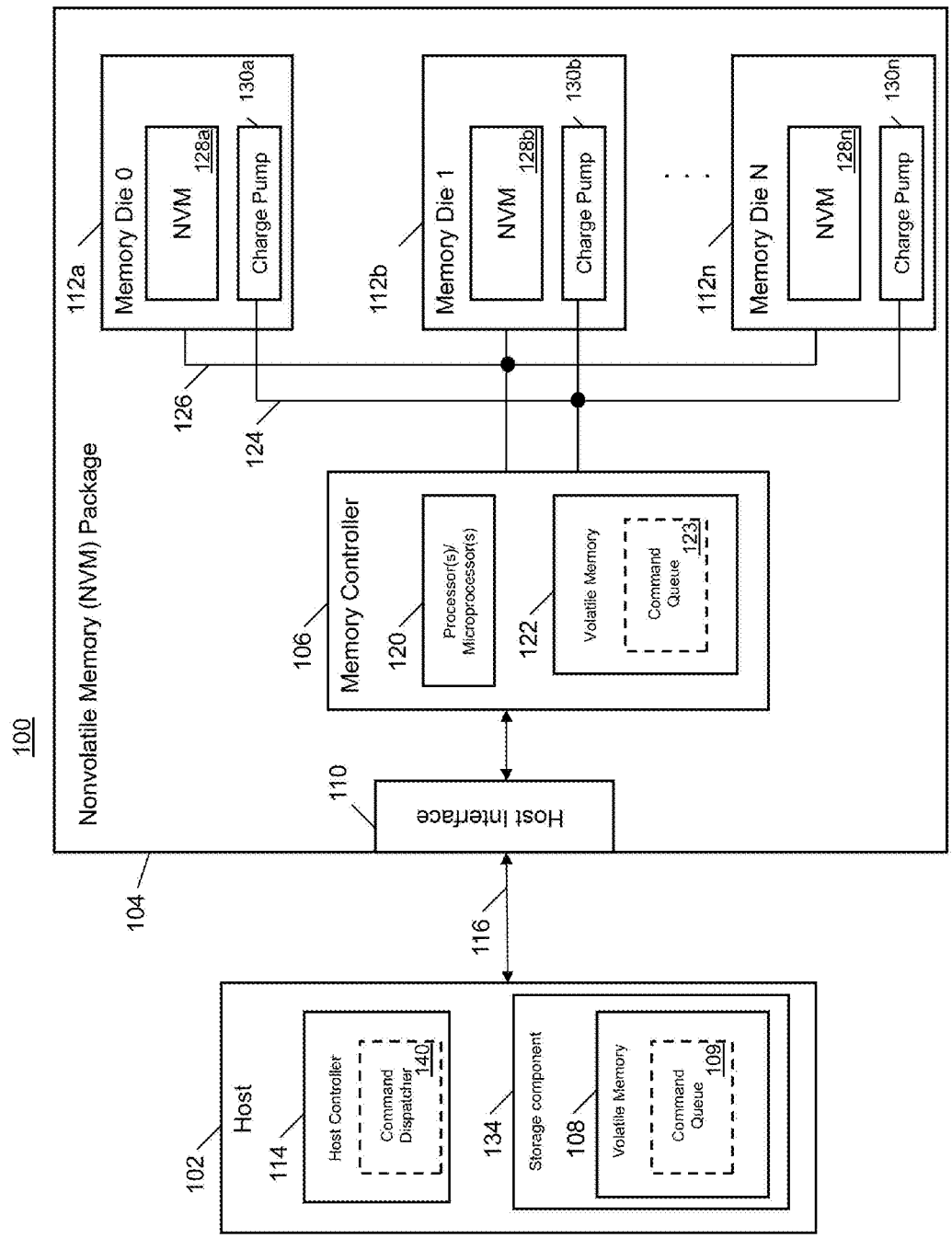
FIG. 1 is a diagram depicting an illustrative system that includes a host and an NVM package with a memory controller in accordance with various embodiments.

FIG. 1 is a diagram depicting system 100, including NVM package 104 and host 102. Host 102 may be configured to provide memory access requests (e.g., read, program, and erase commands) to NVM package 104, which can include memory controller 106, host interface 110, and NVM dies 112a-n with corresponding NVMs 128a-n.

Host 102 can be any of a variety of host devices and/or systems, such as a portable media player, a cellular telephone, a pocket-sized personal computer, a personal digital assistant ("PDA"), a desktop computer, a laptop computer, and/or a tablet computing device. NVM package 104 can include NVMs 128a-n (e.g., in NVM dies 112a-n) and can be a ball grid array package or other suitable type of integrated circuit ("IC") package. NVM package 104 can be part of and/or separate from host 102. For example, host 102 can be a board-level device and NVM package 104 can be a memory subsystem that is installed on the board-level device. In other embodiments, NVM package 104 can be coupled to host 102 with a wired (e.g., SATA) or wireless (e.g., Bluetooth™) interface.

Host 102 can include host controller 114 that is configured to interact with NVM package 104. For example, host 102 can transmit various access requests, such as read, program, and erase operations, to NVM package 104. Host controller 114 can include one or more processors and/or microprocessors that are configured to perform operations based on the execution of software and/or firmware instructions. Additionally or alternatively, host controller 114 can include hardware-based components, such as application-specific integrated circuits ("ASICs"), that are configured to perform various operations. Host controller 114 can format information (e.g., commands and/or data) transmitted to NVM package 104 according to a communications protocol shared between host 102 and NVM package 104.

Host 102 can include volatile memory 108. Volatile memory 108 can be any of a variety of volatile memory types, such as cache memory or RAM. Host 102 can use volatile memory 108 to perform memory operations and/or to temporarily store data that is being read from and/or written to NVM package 104. For example, volatile memory 108 can temporarily store a set of access requests to be sent to, or to store data received from, NVM package 104.

Host 102 can communicate with NVM package 104 over communications channel 116 using host interface 110 and memory controller 106. Communications channel 116 can be any bus suitable for bidirectional communications. Communications channel 116 can be fixed, detachable, or wireless. Communications channel 116 can be, for example, a universal serial bus (USB), serial advanced technology (SATA) bus, or any other suitable bus.

Memory controller 106 can include one or more processors and/or microprocessors 120 that are configured to perform operations based on the execution of software and/or firmware instructions. Additionally or alternatively, memory controller 106 can include hardware-based components, such as ASICs, that are configured to perform various operations. Memory controller 106 can perform a variety of operations, such as dispatching commands issued by host 102.

Host controller 114 and memory controller 106, alone or in combination, can perform various memory management functions, such as garbage collection and wear leveling. In implementations where memory controller 106 is configured to perform at least some memory management functions, NVM package 104 can be termed "managed NVM" (or "managed NAND" for NAND flash memory). This can be in contrast to "raw NVM" (or "raw NAND" for NAND flash memory), in which host controller 114, external to NVM package 104, performs memory management functions for NVM package 104.

As depicted in FIG. 1, memory controller 106 can be incorporated into the same package as NVM dies 112a-n. In other embodiments, memory controller 106 may be physically located in a separate package or in the same package as host 102. In some embodiments, memory controller 106 may be omitted, and all memory management functions that are normally performed by memory controller 106 (e.g., garbage collection and wear leveling) can be performed by a host controller (e.g., host controller 114).

Memory controller 106 may include volatile memory 122. Volatile memory 122 can be any of a variety of volatile memory types, such as cache memory or RAM. Memory controller 106 can use volatile memory 122 to perform access requests and/or to temporarily store data that is being read from and/or written to NVMs 128a-n in NVM dies 112a-n. For example, volatile memory 122 can store firmware and memory controller 106 can use the firmware to perform operations on NVM package 104 (e.g., read/program operations). Memory controller 106 can use NVMs 128a-n to persistently store a variety of information, such as debug logs, instructions, and firmware that NVM package 104 uses to operate.

Memory controller 106 can use shared internal bus 126 to access NVMs 128a-n. Although only one shared internal bus 126 is depicted in NVM package 104, an NVM package can include more than one shared internal bus. Each internal bus can be connected to multiple (e.g., 2, 3, 4, 8, 32, etc.) memory dies as depicted with regard to NVM dies 112a-n. NVM dies 112a-n can be physically arranged in a variety of configurations, including a stacked configuration, and may be, according to some embodiments, integrated circuit ("IC") dies.

NVMs 128a-n can be any of a variety of NVM, such as NAND flash memory based on floating gate or charge trapping technology, NOR flash memory, erasable programmable read only memory ("EPROM"), electrically erasable programmable read only memory ("EEPROM"), ferroelectric RAM ("FRAM"), magnetoresistive RAM ("MRAM"), phase change memory ("PCM"), or any combination thereof.

NVMs 128a-n can be organized into "blocks", which can the smallest erasable unit, and further organized into "pages", which can be the smallest unit that can be programmed or read. In some embodiments, NVMs 128a-n can include multiple integrated circuits, where each integrated circuit may have multiple blocks. Memory locations (e.g., blocks or pages of blocks) from corresponding integrated circuits may form "super blocks". Each memory location (e.g., page or block) of NVMs 128a-n can be referenced using a physical address (e.g., a physical page address or physical block address).

NVM package 104 may also include charge pumps 130a-n, each of which can be associated with a corresponding one of NVM dies 112a-n. In some embodiments, more than one charge pump may be associated with the same NVM die. Conversely, the same charge pump may be shared between multiple NVM dies. In general, charge pumps may be DC to DC converters that can amplify or reduce a given supply voltage. As one example, a charge pump can double a given supply voltage, $V_s$, by connecting a capacitor across the supply, thereby charging the capacitor to $V_s$. The circuit can then be switched such that the capacitor is in series with the power supply, thereby supplying an output voltage of $2V_s$. A constant DC output of $2V_s$ may be achieved by switching the circuit at a relatively high frequency (e.g., 1 kHz-10 MHz) and smoothing the output voltage with an output capacitor.

As depicted in FIG. 1, charge pumps 130a-n may be included within NVM dies 112a-n. For example, charge pumps 130a-n can be fabricated in bare die form on NVM dies 112a-n. In other embodiments, charge pumps 130a-n may be separate modules that are communicatively coupled to NVM dies 112a-n. In typical NVM systems where access requests are dispatched in the order they are received, charge pumps are activated and deactivated for each access request received at an NVM die. This is because each different type of access request generally requires a voltage level tailored to that request. The continual activation and deactivation of charge pumps in these NVM systems contributes to system latency because of the finite time lag associated with activating and deactivating the charge pumps.

Dispatching an early hint command along with a set of consecutive access requests of the same type can alleviate those and other issues found in typical NVM systems. An early hint command may proceed a set of access requests of the same type in order to proactively activate one or more charge pumps. The charge pump(s) may remain activated (e.g., producing a specified voltage level suitable for executing the access requests) until all of the access requests of the same type are executed. After all of the consecutive access requests of the same type are executed, a command may be provided to deactivate the charge pump(s).

System 100 can include one or more command queues (e.g., command queues 109 and/or command queue 123) to assist with providing early hint commands. Command queue 123 of NVM package 104 and command queue 109 of host 102 are drawn in dashed lines to indicate that in various embodiments, one or more command queues may reside in both, either, or neither of host 102 and NVM package 104.

In some embodiments, volatile memory 122 can include one or more command queues 123 for saving access requests (e.g., read, program, and/or erase commands) received from host 102 that have not yet been dispatched to NVM dies 112a-n. The one or more command queues 123 can be block-device level queues. For example, volatile memory 122 may include a single command queue 123 configured to retain all types of access requests (e.g., read, program, and erase commands) and/or volatile memory 122 can include a read queue for retaining read commands, a program queue for retaining program commands, and an erase queue for retaining erase commands. In some embodiments, two or more different types of access requests may be combined in the same command queue. Persons skilled in the art will appreciate that other types of command queues for storing further types of access requests may be available. Consequently, memory controller 106 can scan one or more command queues 123 in order to select one or more commands that may be dispatched to NVM 128*a-n*. Prior to dispatching the one or more commands from a command queue (e.g., command queue 123), memory controller 106 can determine whether to provide early hint commands to one or more charge pumps 130*a-n*.

In embodiments in which two or more different types of access requests are stored in a single command queue and/or all types of access requests are stored in a single command queue, memory controller 106 may be configured to analyze the command queue and provide an early hint command to a charge pump when a certain threshold number of access requests of the same type are found. Access requests that are of the same type (e.g., read, write, or erase requests) may sometimes be referred to as "like access requests." As one example, memory controller 106 may provide an early hint to a charge pump (e.g., charge pump 130*a*) if it determines that there are at least five consecutive read commands for NVM 128*a* in queue 123.

In some embodiments, memory controller 106 may re-queue the single command queue 123 to group together like access requests in a single queue in order to take advantage of providing an early hint command for a group of like access requests. In other embodiments, memory controller 106 may re-queue the single command queue 123 into separate command queues for each type of access request. As used herein, re-queuing a command queue may involve reordering the access requests in a command queue and/or separating access requests in a single command queue into multiple separate command queues.

In other embodiments, host controller 114 may use a command dispatcher 140 to re-queue and group together like access requests into a multi-access command, which can be dispatched to NVM package 104 for further processing and/or execution. These embodiments will be discussed in more detail below with respect to FIG. 2.

In yet further embodiments, volatile memory 122 may include multiple command queues, where each command queue can include access requests addressed to one of NVM dies 112*a-n*. Upon examining the access requests of such a command queue and determining that when a certain threshold number of access requests of the same type are found, memory controller 106 can provide an early hint command to a corresponding charge pump of an NVM die that corresponds to the access requests. Access requests from each of the command queues may thus be dispatched to the different NVM dies in parallel.

In other embodiments, memory controller 106 can re-queue the commands addressed to each NVM die within a single command queue and re-queued commands in each command queue can be dispatched sequentially such that only one NVM die is active at a time (e.g., read commands for NVM die 112*a* can be queued ahead of read commands for NVM die 112*b*, etc.). After the consecutive access requests of the same type from a particular command queue are dispatched, memory controller 106 can remove those commands from the queue and dispatch one or more commands to deactivate the relevant activated charge pumps.

The one or more command queues can generally each be serviced consecutively until the queue is empty, thereby fully utilizing the benefits achieved from using an early hint command (e.g., reduced latency resulting from keeping a charge pump activated for a string of consecutive access requests of the same type). In some embodiments, however, memory controller 106 can have a set of fairness rules for servicing each of the separate command queues. For instance, memory controller 106 may attempt to service the command queues such that the benefits attained from utilizing early hinting to charge pumps are balanced against other system priorities in order to optimize overall system performance. In one example, memory controller 106 may determine that a particular set of access requests in an inactive command queue is of high priority for system function. Consequently, memory controller 106 may interrupt the servicing of the active command queue to run the high priority access requests in the inactive command queue.

In some embodiments, memory controller 106 can provide early hint commands to charge pumps 130*a-n* over shared internal bus 126. However, in other embodiments, system 100 can include side-band communications channel 124, which may reduce latency and improve signal integrity. Side-band communications channel 124 may be used by memory controller 106 to provide early hint commands directly to charge pumps 130*a-n*. According to some embodiments, side-band communications channel 124 may include one or more busses, similar to shared internal bus 126. In other embodiments, side-band communications channel 124 may include individual direct communications links between memory controller and each of charge pumps 130*a-n*.

Although the foregoing embodiments refer to memory controller 106 and command queue 123, a person skilled in the art will appreciate that one or more of those embodiments may be performed by host controller 114 and command queue 109. In particular, in managed NVM systems where memory controller 106 is omitted, host controller 114 may perform any and all of the functions discussed above with respect to memory controller 106. As used herein, host controller 114 and memory controller 106 may each be referred to as an "NVM system controller."

In still further embodiments, an early hint command may be initiated by host 102. In particular, if host 102 initiates a long string of consecutive access requests of the same type (e.g., from command queue 109) and/or transmits a multi-access command to NVM package 104, system 100 can enter a "system mode." For example, system 100 may enter a "program mode" when a long string of consecutive program commands is initiated (e.g., while host 102 "syncs" with another electronic device). Persons skilled in the art will appreciate that similar system modes may be available for other types of access requests.

When system 100 enters such a mode, host 102 can provide a special early hint command to NVM package 104. The early hint command can be received at NVM package 104 (e.g., at memory controller 106) and used to proactively activate one or more of charge pumps 130*a-n*. Consequently, a suitable voltage for the initiated access requests can be provided such that the respective addressed NVM die or dies can be immediately accessed without waiting for the charge pump(s) to be activated and deactivated between each individual access request.

In some embodiments, a command dispatcher can be used to dispatch access requests. For example, FIG. 2 is a graphical view of an illustrative command dispatcher 200 of a system (e.g., command dispatcher 140 of system 100 of FIG. 1). Command dispatcher 200 may be an individual module residing in the system (e.g., in host 102) or command dispatcher 200 may be part of another system component (e.g., software configured to be run on host controller 114).

Command dispatcher 200 may receive multiple access requests to access one or more memory locations of an NVM for a period of time. As used herein, an "NVM" refers collectively to the NVM package of a system (e.g., NVM package 104 FIG. 1). In some embodiments, command dispatcher 200 can save the multiple access requests in a command queue (e.g., command queue 109). If command dispatcher 200 analyzes the command queue and determines that a number of consecutive access requests stored in the command queue exceeds a threshold value, are of the same type, and/or are addressed to the same NVM die, command dispatcher 200 can initiate an early hint command and then dispatch the memory commands to the NVM.

Alternatively, after receiving the multiple access requests, command dispatcher 200 can analyze the command queue and actively select commands 202 that are of the same type (e.g., read, program, or erase commands). As a result, the set of commands 202 may include only read, program, or erase commands. Thus, if during a particular period of time, command dispatcher 200 receives five read commands, followed by two program commands and five read commands, command dispatcher 200 can group together the ten read commands. In embodiments where an NVM package includes multiple NVM dies, command dispatcher 200 may consult a logical to physical address table and only select commands that are addressed to the same NVM die. Command dispatcher 200 can dispatch commands 202 and an early hint command associated with commands 202 to the NVM package for execution.

In other embodiments, after determining set of commands 202, command dispatcher 200 can combine commands 202 into multi-access command 204. In some embodiments, command dispatcher 200 can form multi-access command 204 by combining a set of logical addresses, a set of counters, and a set of buffers associated with a set of commands 202 into an array of logical addresses 206, an array of counters 208, and an array of buffers 210, respectively. For instance, each array of buffers 210 may be used to cache data associated with a particular set of commands 202. Additionally, command dispatcher 200 may attach an early hint command 212 to multi-access command 204. The early hint command may include data used for early hinting, including the number of commands in multi-access command 204 and the voltage required to execute those commands.

At an appropriate time, command dispatcher 200 can dispatch multi-access command 204 to the NVM package. For example, command dispatcher 200 can dispatch multi-access command 204 to the NVM package over a bus (e.g., bus 126 of FIG. 1).

In some embodiments, command dispatcher 200 can dispatch multi-access command 204 to the NVM in the form of an application programming interface ("API") operation. An API can be any suitable interface that can allow a software program or module to interact with other software.

In some embodiments, command dispatcher 200 can dispatch multi-access command 204 to a memory controller (e.g., NVM controller 106 of FIG. 1). Upon receiving multi-access command 204, the memory controller can separate multi-access command 204 into its component set of commands. In some embodiments, the memory controller may then reorder the set of commands such that they may be executed as efficiently as possible. For instance, the memory controller may translate the array of logical addresses associated with the set of commands (e.g., LBA[ ]) into respective physical addresses and reorder the set of commands to group together commands addressed to the same NVM die. In other embodiments, the memory controller may reorder the set of commands such that high priority commands are executed before low priority commands.

Figure 3B:
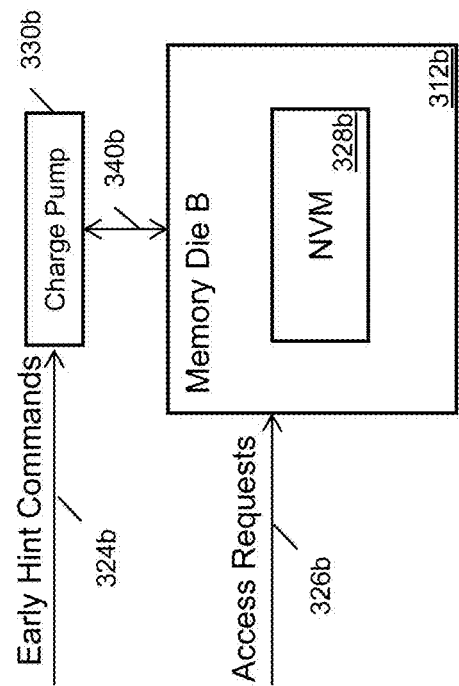
FIGS. 3A and 3B illustrate block diagrams of memory dies that illustrate systems for providing early hinting to nonvolatile memory charge pumps in accordance with various embodiments.
Figure 3A:
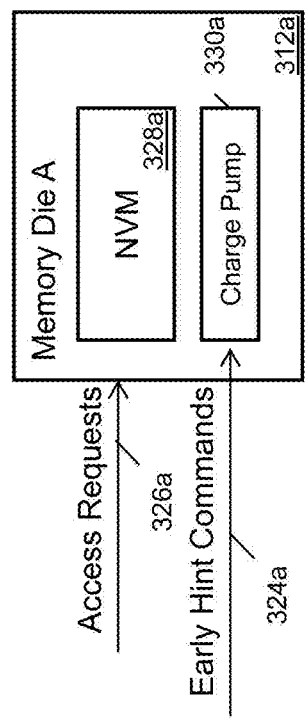

FIGS. 3A and 3B illustrate block diagrams of memory dies 312a and 312b, respectively, which illustrate systems for providing early hinting to nonvolatile memory charge pumps in accordance with various embodiments. FIG. 3A shows memory die 312a, including NVM 328a and charge pump 330a. Memory die 312a may correspond to, for example, one of NVM dies 112a-n of FIG. 1. Memory die 312 can receive access requests and transmit and receive data over data channel 326a (e.g., part of shared internal bus 126 of FIG. 1).

Early hint commands received from a memory controller (e.g., memory controller 106 of FIG. 1) or a host device (e.g., host 102 of FIG. 1) can be received at memory die 312 over side-band communications channel 324a, which can correspond to, for example, side-band communications channel 124 of FIG. 1. Side-band communications channel 324a may be part of a shared bus that communicatively couples a memory controller to more than one charge pump, or it may be a single direct communications link to charge pump 330a. According to some embodiments, side-band communications channel 324a and data channel 326a may communicate with memory die 312a via separate I/O interfaces. In other embodiments, however, one of data channel 326a and side-band communications channel 324a can be omitted, and memory die 312a can communicate with the memory controller over a single communications channel.

FIG. 3B shows memory die 312b, including NVM 328b. Memory die 312b can be communicatively coupled to charge pump 330b, which exists outside of, and separate from, memory die 312b. Charge pump 330b can receive early hint commands over side-band communications channel 324b, while access requests and data transfers can be transmitted over data channel 326b. A separate charge pump channel 340b can be connected between charge pump 330b and memory die 312b in order to send and receive signals between the components, as well as to transfer the output voltage of charge pump 330b to memory die 312b when required. In embodiments in which side-band communications channel 324 is omitted, memory die 312b can communicate with charge pump 330b via charge pump channel 340b to deliver early hint and/or single access request commands.

Figure 4:
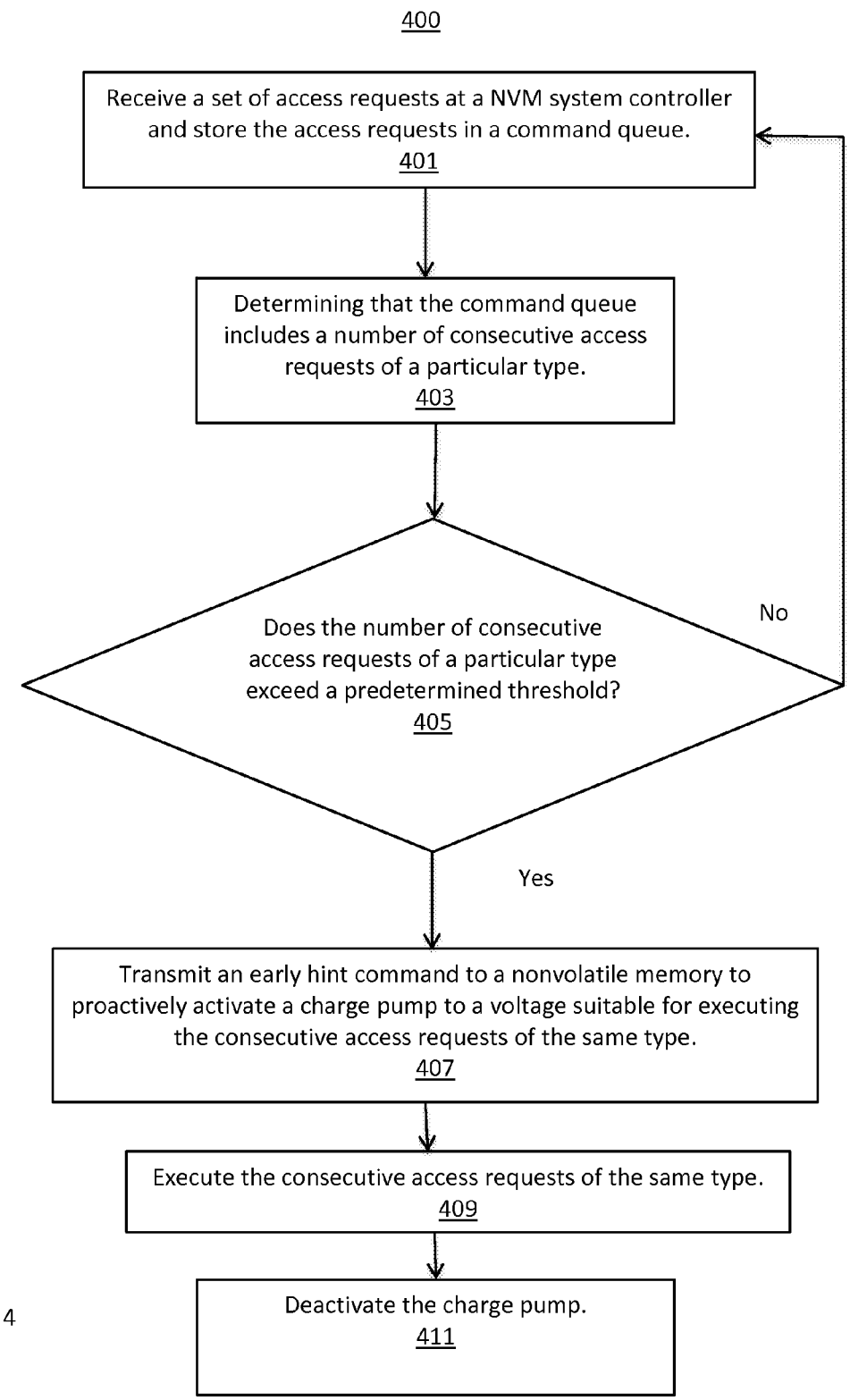
FIG. 4 is a flowchart of an illustrative process for providing early hinting to nonvolatile memory charge pumps in accordance with various embodiments.
Figure 5:
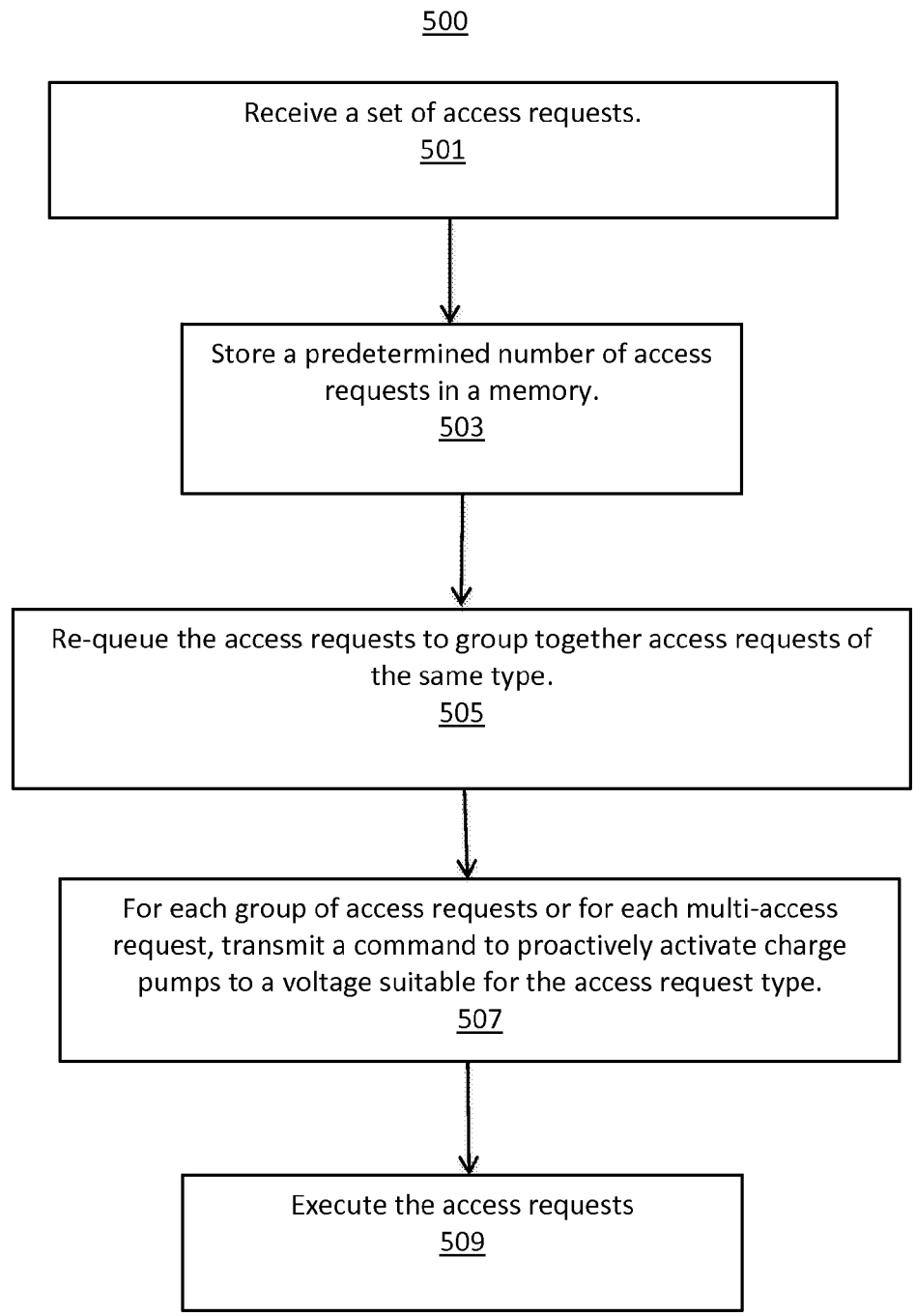
FIG. 5 is another flowchart of an illustrative process for providing early hinting to nonvolatile memory charge pumps in accordance with various embodiments.

Referring now to FIGS. 4 and 5, flowcharts of illustrative processes are shown in accordance with various embodiments. These processes may be executed by one or more components in a system (e.g., system 100 of FIG. 1 or electronic device 200 of FIG. 2). For example, at least some of the steps in the processes of FIGS. 4 and 5 may be performed by control circuitry (e.g., host controller 114 and/or memory controller 106 of FIG. 1).

Turning first to FIG. 4, process 400 is shown for providing early hinting to nonvolatile memory charge pumps. Process 400 may begin at step 401, at which a set of access requests can be received at an NVM system controller (e.g., host controller 114 or memory controller 106 of FIG. 1). In addition, the set of access requests can be stored in a command queue. According to some embodiments, the set of access requests may be received from a file system at a host controller (e.g., host controller 114 of FIG. 1). In other embodiments, the set of access requests may be received at a memory controller (e.g., memory controller 106 of FIG. 1) from a host device (e.g., host 102 of FIG. 1).

At step 403, the controller can determine that the command queue includes a number of consecutive access requests of a particular type. Then, at step 405, the controller can determine whether the number of consecutive access requests of the particular type exceeds a predetermined threshold. If the number of consecutive access requests of the same type does not exceed the predetermined threshold, process 400 can return to step 401. On the other hand, at step 407, upon determining that the number of consecutive access requests of the particular type exceeds a predetermined threshold, the controller can transmit an early hint command to an NVM (e.g., NVM 128a of FIG. 1) to proactively activate a charge pump to a voltage suitable for executing the consecutive access requests of the same type. Then, at step 409, the consecutive access requests of the same type can be executed. Continuing to step 411, the charge pump can be deactivated.

For instance, the controller can analyze the command queue and determine that it contains a long string of consecutive read commands (step 403). The controller can then compare the number of consecutive read commands to a predetermined threshold for initiating an early hint command. In one particular example, the predetermined threshold may be set at three consecutive access requests at the same type. Thus, if the number of consecutive read commands exceeds three, the controller can transmit an early hint command to the NVM (step 405). The early hint command can proactively activate the charge pump associated with the NVM to provide a voltage suitable for executing the consecutive read commands (step 407). Once all of the consecutive read commands are executed (step 409), the charge pump can be deactivated (step 411).

Turning now to FIG. 5, process 500 is shown for providing early hinting to nonvolatile memory charge pumps. Process 500 may begin at step 501, in which a set of access requests can be received at a controller (e.g., host controller 114 or memory controller 106 of FIG. 1). Next, at step 503, a predetermined number of access requests can be stored in a memory. For example, a set of access requests can be stored as a command queue in a volatile memory (e.g., volatile memory 108 or volatile memory 122 of FIG. 1).

At step 505, the controller can re-queue the access requests to group together access requests of the same type. In some embodiments, a single command queue can be re-queued such that all, or a predetermined number, of access requests of the same type stored in the memory are grouped together. For example, the controller can re-queue the access requests such that all of the program commands are queued before all of the read commands, and all of the read commands are queued before all of the erase commands. In some embodiments, the controller can segregate all of the access requests of the same type into separate command queues. In further embodiments, the controller can re-queue the access requests based on which die of a multi-die NVM system the access requests are directed to. For example, the controller may re-queue the access requests stored in the command queue to group together all of the program commands for a first NVM die (e.g., NVM die 112a of FIG. 1) before all of the program commands for a second NVM die (e.g., NVM die 112b of FIG. 1,), etc. In additional embodiments, the controller may organize the re-queued access requests into a multi-access request (e.g., multi-access request 204 of FIG. 2).

At step 507, for each group of access requests, or, alternatively, for each multi-access request, the controller can transmit a command to proactively activate charge pumps to a voltage suitable for the access request type. For instance, prior to, or concurrently with, servicing of the one or more command queues, an early hint command can be dispatched to the relevant charge pump or pumps associated with the access requests. As one particular example, before the controller begins to dispatch a string of consecutive program commands to an NVM die, an early hint command can be dispatched to that die such that the charge pump associated with that die can be proactively activated to generate a voltage suitable to execute the program commands. At step 509, the access requests can be executed.

It is to be understood that the steps shown in processes 400 and 500 are merely illustrative and that existing steps may be modified or omitted, additional steps may be added, and the order of certain steps may be altered.

While there have been described systems and methods for providing early hinting to charge pumps of a nonvolatile memory system, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A method comprising:
receiving a set of access requests at a nonvolatile memory ("NVM") system controller;
storing the set of access requests in a command queue;
determining that the command queue contains a number of consecutive access requests of a particular type for an NVM;
determining that the number of consecutive access requests of the particular type exceeds a predetermined threshold;
transmitting a command from the NVM system controller to the NVM to proactively activate a charge pump to a voltage suitable for executing the consecutive access requests of the particular type;
executing the consecutive access requests of the particular type; and
deactivating the charge pump.

2. The method of claim 1, wherein the consecutive access requests of a particular type are one of read commands, program commands, and erase commands.

3. The method of claim 1, wherein the NVM system controller comprises a host controller of a host device.

4. The method of claim 1, wherein the NVM system controller comprises a memory controller of an NVM package.

5. The method of claim 1, wherein the predetermined threshold is three.

6. The method of claim 1, wherein the command transmitted to the NVM to proactively activate the charge pump is transmitted via a side-band communications channel.

7. A method for proactively activating charge pumps of a nonvolatile memory ("NVM") system, the method comprising:
receiving a plurality of access requests;
storing the plurality of access requests in a command queue;
re-queuing the plurality of access requests into groups of access requests of the same type; and
for each group of access requests of the same type:
transmitting a command to an NVM to proactively activate the one or more charge pumps of the NVM to a voltage suitable for the group of access requests of the same type; and
executing each access request of the group of access requests of the same type.

8. The method of claim 7, wherein the command to proactively activate the one or more charge pumps is transmitted via a side-band communications channel.

9. The method of claim 7, wherein re-queuing the plurality of access requests comprises reordering access requests within a single command queue.

10. The method of claim 7, wherein re-queuing the plurality of access requests comprises segregating access requests of the same type into separate command queues.

11. The method of claim 7, wherein re-queuing the plurality of access requests comprises combining access requests of the same type into a multi-access request.

12. The method of claim 7, wherein the NVM system is a multi-die NVM system.

13. The method of claim 12, further comprising re-queuing the plurality of access requests into groups of access requests based on which die of a multi-die NVM system the access requests are directed to.

14. The method of claim 7, wherein the access request types comprise at least one of:
  program commands;
  read commands; and
  erase commands.

15. A system for providing early hinting to nonvolatile memory charge pumps, comprising:
  at least one nonvolatile memory ("NVM") die;
  at least one charge pump associated with each of the at least one NVM die;
  volatile memory comprising a command queue for storing a plurality of access requests; and
  an NVM system controller communicatively coupled to the at least one charge pump and the at least one NVM die, wherein the NVM system controller is configured to:
    determine whether the plurality of access requests stored in the command queue comprises a number of consecutive access requests of the same type exceeding a predetermined threshold;
    in response to determining that the plurality of access requests stored in the command queue contains the number of consecutive access requests of the same type exceeding the predetermined threshold, transmit a command to the at least one charge pump to generate an output voltage suitable for executing the consecutive access requests of the same type; and
    dispatch the consecutive access requests of the same type to the at least one NVM die for execution.

16. The system of claim 15, wherein the at least one charge pump is external to, and communicatively coupled to, the at least one NVM die.

17. The system of claim 15, wherein the at least one charge pump is internal to the at least one NVM die.

18. The system of claim 15, wherein the NVM system controller is further configured to re-queue the plurality of access requests stored in the command queue into groups of access requests of the same type.

19. The system of claim 15, wherein the NVM system controller is further configured to combine the consecutive access requests of the same type into a multi-access request.

20. The system of claim 15, wherein the NVM system controller is further configured to segregate the plurality of access requests stored in the command queue into separate command queues.

21. The system of claim 15, further comprising a side-band communications channel between the NVM system controller and the at least one charge pump, wherein the side-band communications channel is configured to relay early hint commands from the NVM system controller to the at least one charge pump.

22. The system of claim 21, wherein the command transmitted to the at least one charge pump to generate the output voltage suitable for executing the consecutive access requests of the same type is transmitted over the side-band communications channel.

\* \* \* \* \*